(12) United States Patent
Seko et al.

(10) Patent No.: US 6,388,888 B1
(45) Date of Patent: May 14, 2002

(54) SEMICONDUCTOR DEVICE AND PROCESS FOR MANUFACTURING THE SAME, LIQUID CRYSTAL MODULE AND PROCESS FOR MOUNTING THE SAME

(75) Inventors: Toshiharu Seko, Yamabe-gun; Kenji Toyosawa, Ikoma, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/597,582

(22) Filed: Jun. 20, 2000

(30) Foreign Application Priority Data

Aug. 6, 1999 (JP) .......................... 11-223463

(51) Int. Cl.$^7$ ................................. H05K 7/10
(52) U.S. Cl. .................. 361/767; 361/748; 361/749; 361/750; 361/760; 361/783; 361/820; 174/259; 174/268; 257/668; 257/669; 438/107; 438/110; 438/113; 438/114
(58) Field of Search .................. 174/259, 268; 257/668, 669; 29/827, 829; 438/107, 110, 113, 114; 361/748, 749, 750, 760, 783, 820

(56) References Cited

U.S. PATENT DOCUMENTS

| | | | |
|---|---|---|---|
| 4,283,839 A | * 8/1981 | Gursky | 29/589 |
| 5,173,766 A | * 12/1992 | Long et al. | 257/687 |
| 5,361,490 A | * 11/1994 | Higgins, III et al. | 29/827 |
| 5,378,581 A | * 1/1995 | Vernon | 430/313 |
| 5,548,091 A | * 8/1996 | DiStefano et al. | 174/260 |
| 5,679,194 A | * 10/1997 | Fjelstad et al. | 156/150 |
| 5,807,453 A | * 9/1998 | Smith et al. | 156/150 |
| 6,093,970 A | * 7/2000 | Ohsawa et al. | 257/777 |

FOREIGN PATENT DOCUMENTS

JP          9-172041          6/1997

* cited by examiner

*Primary Examiner*—Jayprakash N. Gandhi
*Assistant Examiner*—Thanh S. Phan
(74) *Attorney, Agent, or Firm*—Nixon & Vanderhye P.C.

(57) ABSTRACT

A semiconductor device comprising a patterned wiring including a connector for external connection formed on an elongate base film, a semiconductor element or the semiconductor element and a component other than the semiconductor element mounted on and electrically connected with a portion for connection of the patterned wiring, an elongate reinforcement member provided on a surface of the base film opposite to a surface on which the patterned wiring is formed, the reinforcement member having sprocket holes at positions corresponding to the lengthwise sides of the base film, wherein the reinforcement member is further provided on said opposite base film surface in a region corresponding with a region on which the connector for external connection is formed.

8 Claims, 6 Drawing Sheets

SEMICONDUCTOR DEVICE AND PROCESS FOR MANUFACTURING THE SAME, LIQUID CRYSTAL MODULE AND PROCESS FOR MOUNTING THE SAME

CROSS-REFERENCE TO RELATED APPLICATION

This application is related to Japanese application No. HEI 11 (1999)-223463 filed on Aug. 6, 1999, whose priority is claimed under 35 USC §119, the disclosure of which is incorporated by reference in its entirety.

BACKGROUND OF THE INVENTION

1. Field of the Invention

The present invention relates to a semiconductor device comprising a semiconductor element connectively mounted on a flexible substrate. More particularly, it relates to a chip-on-film (hereinafter referred to as COF) structure and a tape carrier package (hereinafter referred to as TCP).

2. Description of Related Art

Figure 9:
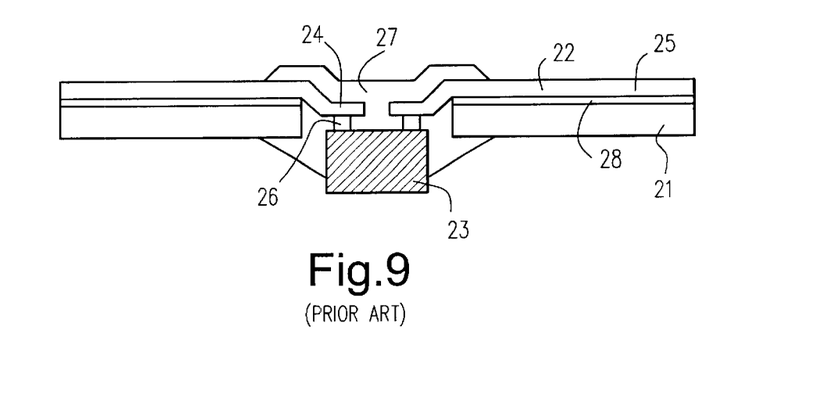
FIG. 9 is a sectional view illustrating a conventional TCP.

In a TCP, as shown in FIG. 9, an aperture (device hole) is provided in advance through a base film 21 of an insulating film (tape) in a region for mounting a semiconductor element. A patterned wiring 22 is formed on the base film 21 with the intervention of an adhesive layer 28 and extends toward the aperture, at which an edge 24 of the patterned wiring is connected to a semiconductor element 23. The base film of the TCP is customarily a polyimide film of 50 or 75 $\mu$m thick. The polyimide film of such thickness is sufficient in mechanical strength. Therefore the film is wound on a reel using sprocket holes formed in the outer sides of the TCP and conveyed on reel-to-reel in an assembly line.

Figure 10:
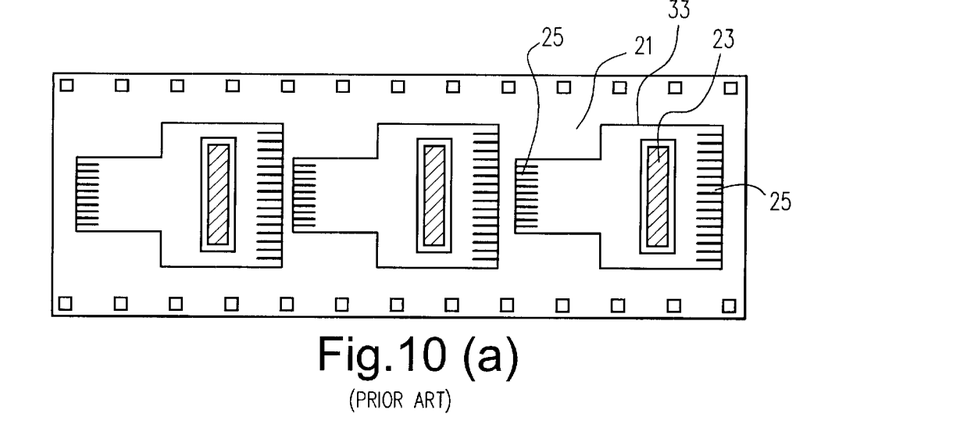
Figure 10B:
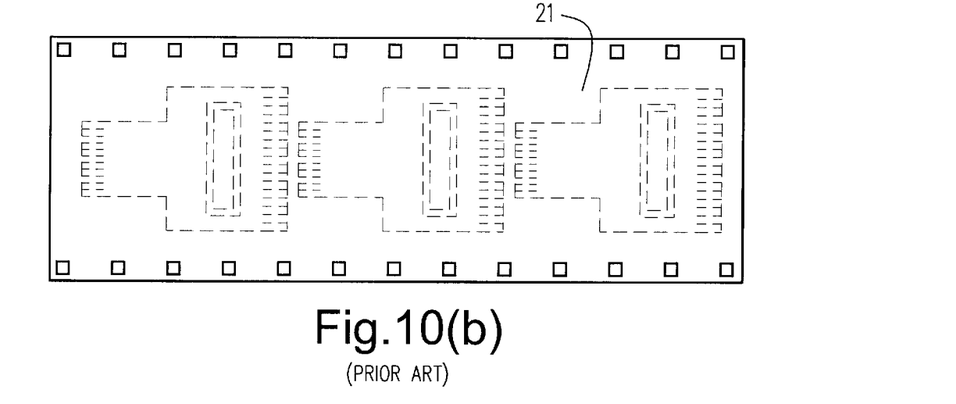
Figure 11:
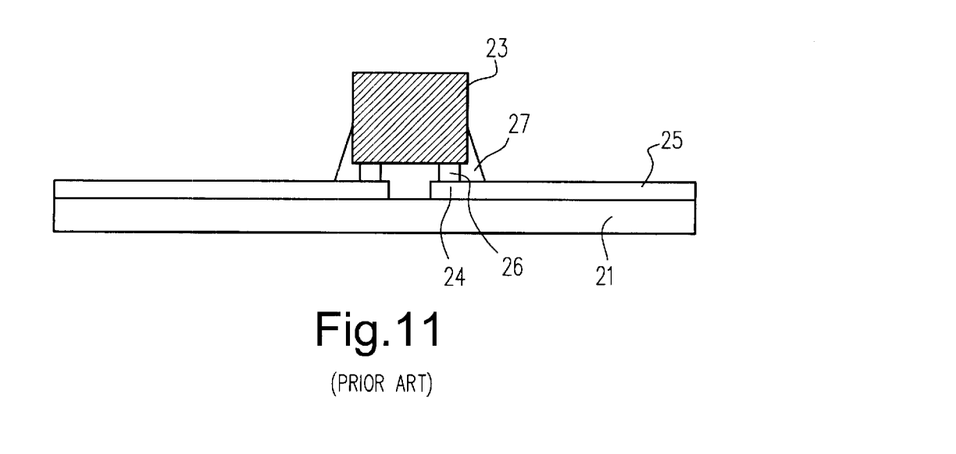
FIG. 11 is a sectional view illustrating the conventional COF.

Different from the TCP, a base film 21 of a COF does not form an aperture for mounting a semiconductor device 23 as shown in FIGS. 10(a), 10(b) and 11. Briefly, the semiconductor element 23 is connectively mounted on the surface of the base film 21. In view of applications of the COF, a flexible thin insulating tape is used as the base film, on which a patterned wiring is arranged and electrically connected to a corresponding terminal of the semiconductor element. A connector for externally connecting the patterned wiring is connected to a liquid crystal display, a printed substrate and the like. A solder resist is applied for ensuring insulation on an exposed portion of the patterned wiring other than the wiring connected as mentioned above.

The COF utilizes, as the base material, a polyimide film of 20, 25 or 40 $\mu$m thick cut in a sheet form. When it is conveyed on reel-to-reel similarly to the TCP, in particular when the COF of not more than 25 $\mu$m thick is to be fabricated, a reinforcement member of a thick film is adhered as a reinforcement tape for conveying the TCP. The reinforcement member is removed by stamping the base material with a mold to separate each user-utilizing area, and is not used anymore as the reinforcement member after the TCP is conveyed.

FIG. 9 is a sectional view illustrating the conventional TCP, FIG. 10(a) is a plan view observed from a semiconductor element-mounted surface of the conventional COF, FIG. 10(b) is a plan view observed from a surface opposite to the semiconductor element-mounted surface and FIG. 11 is a sectional view illustrating a structure of the conventional COF. In FIGS. 9 to 11, reference numeral 21 denotes the base film, 22 the patterned wiring, 23 the semiconductor element, 24 a portion of the patterned wiring connected with the semiconductor element, 25 a connector for externally connecting the patterned wiring, 26 a bump, 27 a resin, and 33 an outer shape into which the semiconductor device is stamped.

The above-mentioned COF has the drawback that the base material is thin and elastic so that width of an outer lead row and that of an inner lead row (total pitch) are imprecisely sized. Also, the reinforcement member is adhered after stamping the semiconductor element, which increases the production costs and the reinforcement member may not be positioned at the right position. The base material does not bend at a fixed position when mounting it on a liquid crystal panel, therefore it is difficult to incorporate the mounting step into the assembly line. Further, warpage of the film occurs in a reflow process performed after the components are mounted.

Now, the COF is expected to satisfy a demand of multiplying the number of pins. In order to satisfy this demand as well as another demand of device miniaturization, the connectors for externally connecting the patterned wirings and the portions of the patterned wirings connected with the semiconductor element need to be arranged with fine pitches therebetween. There are several problems to be solved to make the fine pitches, one of which is that the above-mentioned total pitch should be sized with great precision. A thin insulating tape having high elasticity has been used to meet a demand of flexibility and the reduction in thickness. However, the thin insulating tape is poor in mechanical strength and may be excessively expanded or contracted. In particular, the base material used for the COF is highly absorbent and less stable as compared to the base material used for the TCP, for which the above-mentioned fine pitches are difficult to obtain.

The TCP requires the base material of about 20 to 25 $\mu$m thick because a low temperature treatment needs to be performed to mount the TCP on a plastic liquid crystal panel. Thus, the TCP also suffers from drawbacks similar to those of the COF.

SUMMARY OF THE INVENTION

A semiconductor device of the present invention is a semiconductor device in which a patterned wiring including a connector for external connection is formed on an elongate base film, a semiconductor element or the semiconductor element and a component other than the semiconductor element are mounted on and electrically connected with a portion for connection of the patterned wiring, an elongate reinforcement member is provided on a surface of the base film opposite to a surface on which the patterned wiring is formed, the reinforcement member having sprocket holes at positions corresponding to the lengthwise sides of the base film, characterized in that the reinforcement member is further provided on said opposite base film surface in a region corresponding with a region on which the connector for external connection is formed.

In the semiconductor device according to the present invention, it is desirable that the reinforcement member is provided directly or with the intervention of an adhesive layer on the opposite base film surface in the region corresponding with the region on which the connector for external connection is formed.

Desirably, the reinforcement member is provided on the base film with the intervention of the adhesive layer so that the reinforcement member can be exfoliated (or peeled) at the adhesive layer.

Also desirably, the reinforcement member is provided on the opposite base film surface such that the reinforcement member can be exfoliated from the base film at an interface therebetween.

Further preferably, the reinforcement member is further provided on the opposite base film surface in a region corresponding with a region on which the semiconductor element or the semiconductor element and the component other than the semiconductor elements are mounted.

The thickness of the reinforcement member is desirably 15 μm or more to 400 μm or less.

Also desirably, the reinforcement member comprises an organic film.

A process for manufacturing a stamped semiconductor device according to the present invention is characterized in that the base film constituting a semiconductor device (unstamped semiconductor device) described in the preceding paragraphs is separated by using an outer shape stamping to have a predetermined shape, thereby to cut out a region of the reinforcement member including the sprocket holes and leave the reinforcement member on said opposite base film surface only in a region corresponding with the region on which the connector for external connection is formed, only in a region corresponding with the regions on which the connector for external connection is formed and the semiconductor element is formed, or only in a region corresponding with the regions on which the connector for external connection is formed, the semiconductor element is mounted and the component other than the semiconductor element is mounted.

A liquid crystal module according to the present invention is characterized in that the unstamped semiconductor device is stamped to have a predetermined shape and mounted on a liquid crystal panel.

A process for mounting the liquid crystal module according to the present invention is characterized by stamping the unstamped semiconductor device to have a predetermined shape and mounting it on the liquid crystal panel to fabricate a liquid crystal module, exfoliating the reinforcement member located at least on a bend portion of the base film, and mounting the liquid crystal module on a desired electric product.

Further, a process for mounting a liquid crystal module according to the present invention is characterized by removing all the reinforcement member provided on the base film in the above-mentioned liquid crystal module and mounting the liquid crystal module on a desired electric product.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 1(*a*) is a plan view observed from a semiconductor element-mounted surface of a COF according to Example 1 of the present invention, FIG. 1(*b*) is a plan view observed from a reinforcement member-mounted surface of the COF;

FIGS. 6(*a*) to 6(*c*) are views illustrating a step of mounting a COF according to Example 5 of the present invention on a liquid crystal panel;

FIGS. 7(*a*) and 7(*b*) are views illustrating a step of mounting a COF according to Example 6 of the present invention on a liquid crystal panel;

FIGS. 8(*a*) and 8(*b*) are views illustrating a step of mounting a COF according to Example 7 of the present invention on a liquid crystal panel;

FIG. 10(*a*) is a plan view observed from a semiconductor element-mounted surface of a conventional COP and FIG. 10(*b*) is a plan view observed from a surface opposite to the semiconductor element-mounted surface.

DESCRIPTION OF THE PREFERRED EMBODIMENTS

Hereinafter, the semiconductor device of the present invention will be explained in detail with reference to examples thereof.

Figure 1:
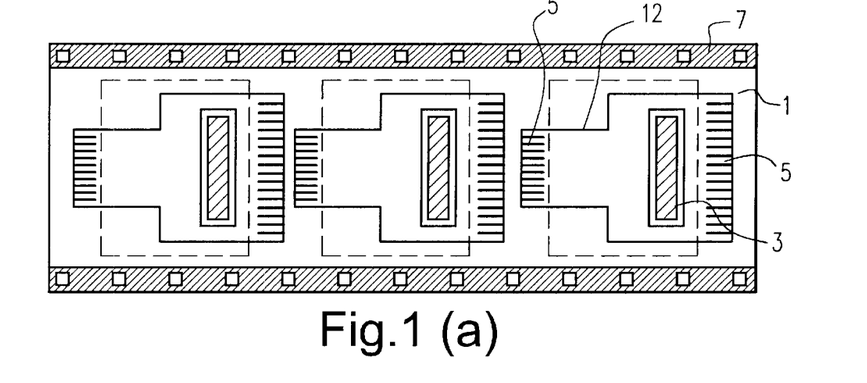
Figure 2:
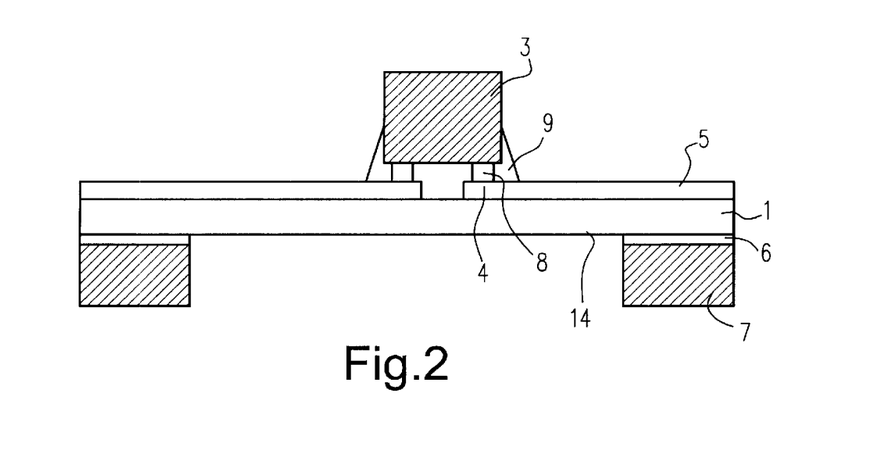
FIG. 2 is a sectional view illustrating the COF according to Example 1 of the present invention.
Figure 3:
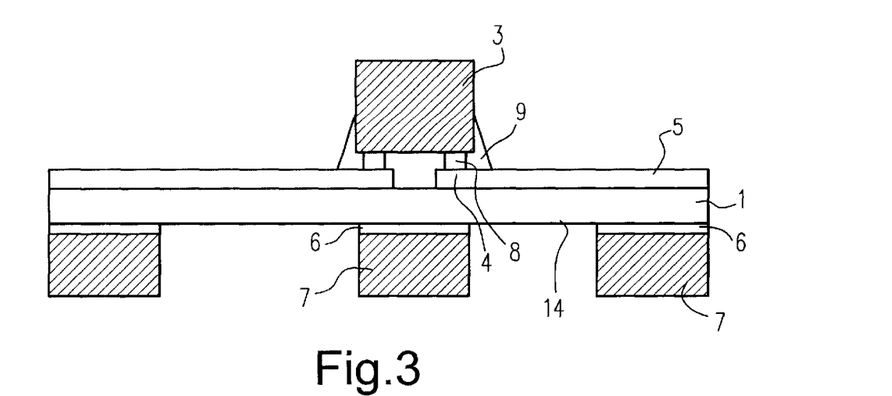
FIG. 3 is a sectional view illustrating a COF according to Example 2 of the present invention.
Figure 4:
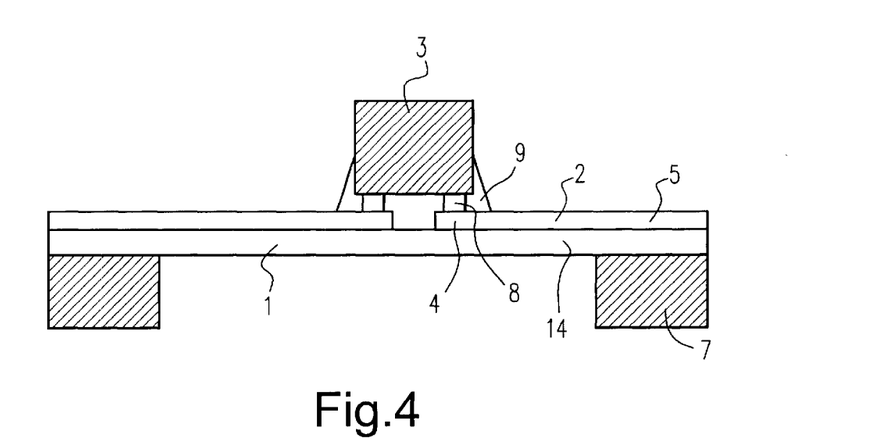
FIG. 4 is a sectional view illustrating a COF according to Example 3 of the present invention.
Figure 5:
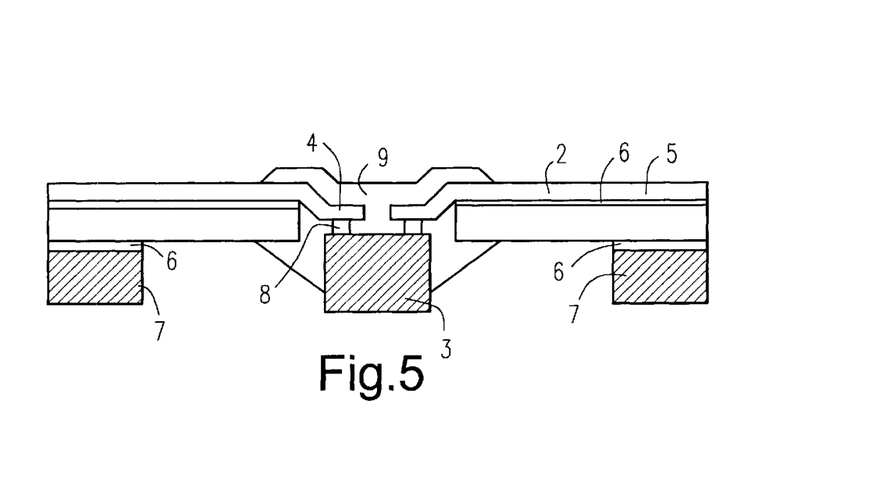
FIG. 5 is a sectional view illustrating a TCP according to Example 4 of the present invention.
Figure 6A:
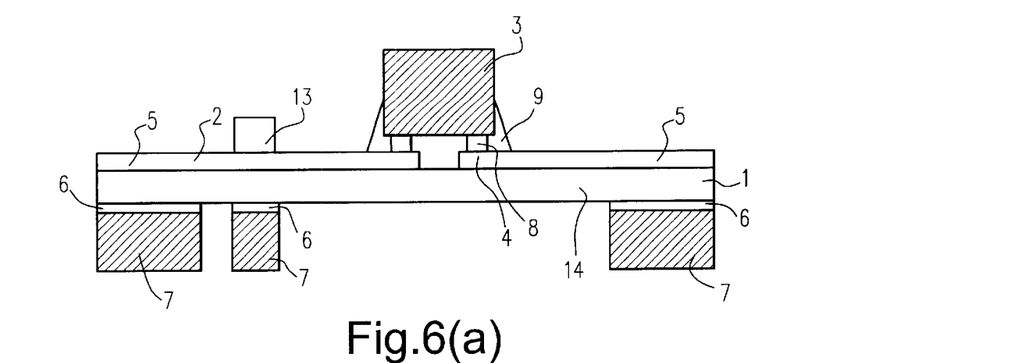
Figure 6B:
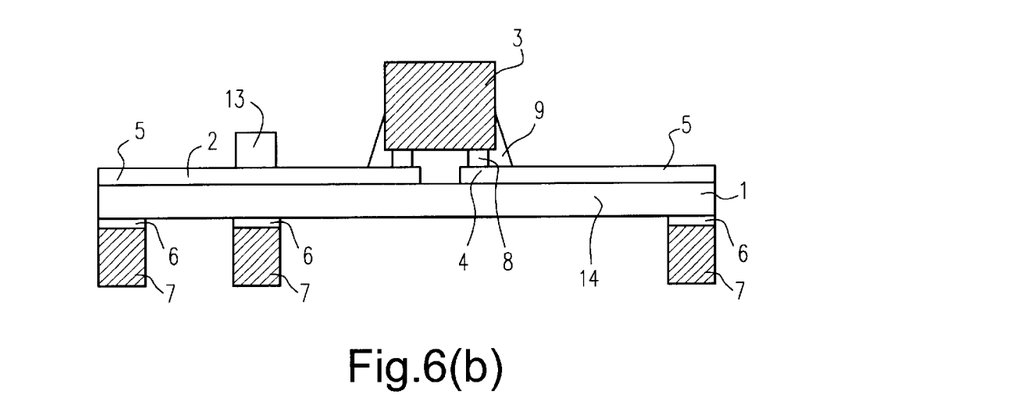
Figure 6C:
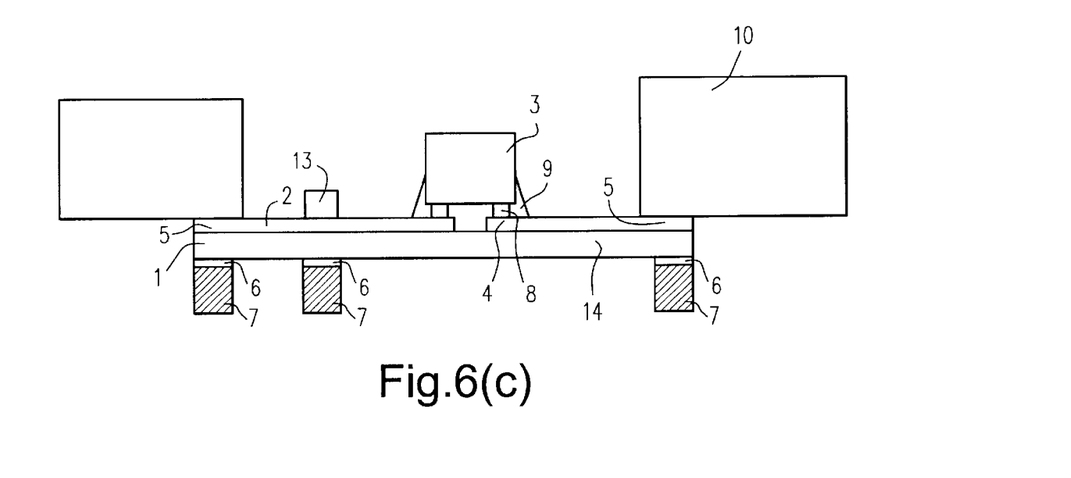
Figure 7A:
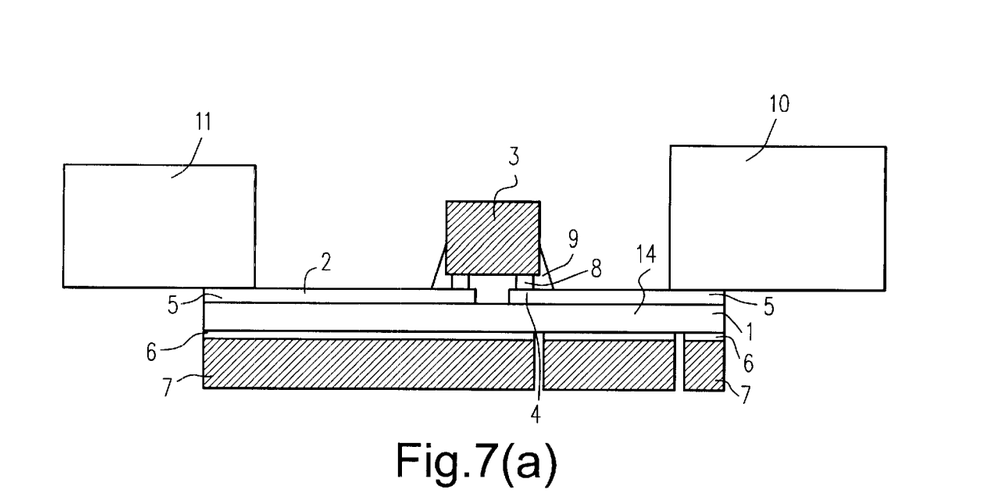
Figure 7B:
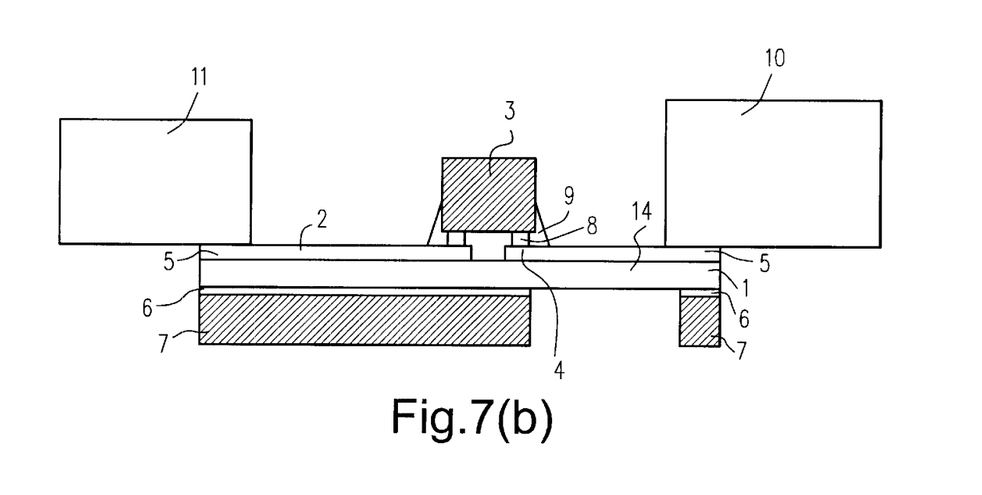
Figure 8A:
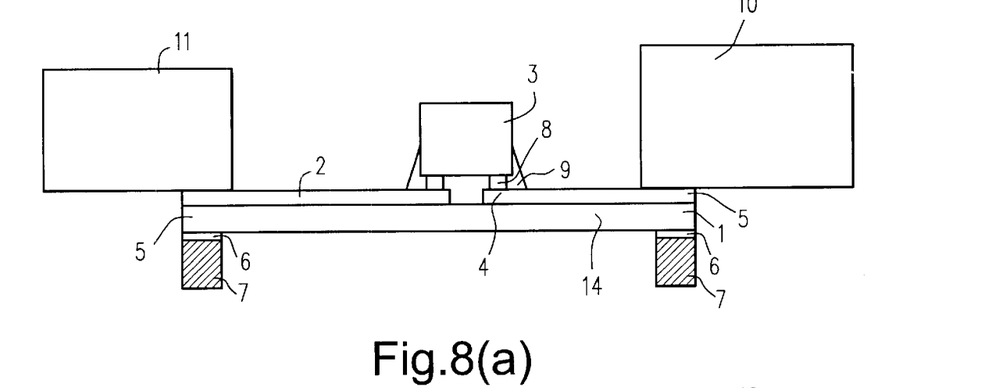
Figure 8B:
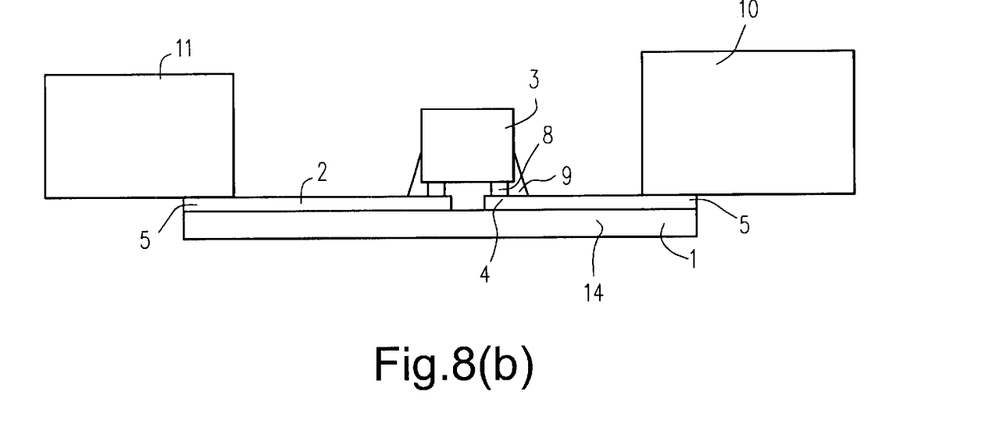

FIG. 1(*a*) is a plan view observed from a semiconductor element-mounted surface of a COF according to Example 1 of the present invention, FIG. 1(*b*) is a plan view observed from a reinforcement member-mounted surface of the COF, FIG. 2 is a sectional view of FIGS. 1(*a*) and 1(*b*), FIG. 3 is a sectional view illustrating a COF according to Example 2 of the present invention, FIG. 4 is a sectional view illustrating a COF according to Example 3 of the present invention, FIG. 5 is a sectional view illustrating a TCP according to Example 4 of the present invention, FIGS. 6(*a*) to 6(*c*) are views illustrating a step of mounting a COF according to Example 5 of the present invention on a liquid crystal panel, FIGS. 7(*a*) and 7(*b*) are views illustrating a step of mounting a COF according to Example 6 of the present invention on a liquid crystal panel, and FIGS. 8(*a*) and 8(*b*) are views illustrating a step of mounting a COP according to Example 7 of the present invention on a liquid crystal panel.

In FIGS. 1(*a*) to 8(*b*), reference numeral 1 denotes a base film, 2 a patterned wiring made of a copper foil, 3 a semiconductor element, 4 a portion of the patterned wiring connected with the semiconductor element, 5 a connector for externally connecting the patterned wiring, 6 an adhesive layer, 7 a reinforcement member of a polyimide insulating film, 8 a bump, 9 a sealing resin, 10 a liquid crystal panel, 11 a printed substrate, 12 an outer shape into which the semiconductor device is stamped, 13 a mounted component, and 14 a bend portion of the base film which will bend when the base film is mounted on an electric product.

In the present invention, the elongate reinforcement members having sprocket holes for conveyance are provided on a surface of the elongate base film opposite to a surface on which the patterned wiring is formed. The reinforcement members are provided on a region of the opposite base film surface corresponding with a region in which the connector for externally connecting the patterned wiring is formed, a region of the opposite base film surface corresponding with a region in which the semiconductor element and the patterned wiring are connected, and a region of the opposite base film surface corresponding with a region in which the other component and the patterned wiring are connected, respectively. The reinforcement members are provided on the base film surface with or without the intervention of the adhesive layer. The base film and the reinforcement member are adhered so that they can be separated at the adhesive layer or at an interface between them.

The base film used for the COF of the present invention does not have an aperture for mounting the semiconductor element and is made of a highly elastic and flexible polyimide insulating film of 20, 25 and 40 μm thick. The patterned wiring made of a copper foil is provided on the surface of the insulating film without providing the adhesive layer therebetween. The surface of the copper foil wiring is tin or gold-plated (not shown). A solder resist (not shown) is applied, to ensure insulation, on an exposed portion of the patterned wiring other than a portion of the wiring connected with the semiconductor element and the connector for externally connecting the patterned wiring. The connector for externally connecting the patterned wiring is connected with a liquid crystal panel, a printed substrate and the like.

As shown in FIGS. 1(a), 1(b) and 2, in Example 1, the polyimide reinforcement member 7 is provided on a surface of the elongate base film 1 opposite to a surface on which the patterned wiring is formed. The reinforcement member has the thickness of 15 to 400 μm and is provided with sprocket holes at positions corresponding the lengthwise sides of the base film. It is preferred to use the reinforcement member 7 provided with the sprocket holes at positions corresponding the lengthwise sides of the base film for a reel-to-reel conveyance of the COF. The reinforcement member 7 is also formed, with the intervention of the adhesive layer 6, on a region of the opposite surface of the base film 1 corresponding with a region on which the connector 5 for externally connecting the patterned wiring 2 is formed. The reinforcement member requires the thickness of about 400 μm to endure an insert into the connector.

In addition to the regions shown in FIGS. 1(a), 1(b) and 2, the polyimide reinforcement members 7 of 15 to 400 μm thick are provided with the intervention of the adhesive layer 6 on the opposite surface of the base film 1 in a region corresponding with the region on which the semiconductor element 3 is mounted (Example 2 shown in FIG. 3) and in a region corresponding with the region on which the other component 13 (Example 5 shown in FIGS. 6(a) to 6(c)) is mounted, respectively. The reinforcement member loses its function when its thickness is less than 15 μm. The reinforcement member is desirably a polyimide film, or an organic film such as a polyester film having elasticity similar to the base film.

The reinforcement member 7 formed on the opposite base film surface in the region corresponding with the region on which the connector for external connection is formed remains on the above-mentioned predetermined region directly or with the intervention of the adhesive layer 6 after stamping a region of the reinforcement member including sprocket holes with a mold to pattern the base film 1 into a predetermined shape.

The adhesive layer 6 is desirably made of a thermosetting adhesive or an ultraviolet-curing adhesive. Using the adhesive layer 6 thus formed and suitably controlling the adhering conditions such as temperature, time and pressure, the reinforcement member 7 is adhered by an adhesive force at which the reinforcement member 7 can be easily exfoliated (or peeled) from the base film 1 at the adhesive layer 6 as required, after mounting the TCP or the COF of the present invention onto the liquid crystal panel 10, the printed substrate 11 and the like. The adhesive force at which the reinforcement member can be easily exfoliated signifies an adhesive force at which a person can exfoliate the reinforcement member with his hands. More specifically, it signifies an adhesive force of about 500 gf/cm to 1000 gf/cm, at which the reinforcement member can be exfoliated at an interface between the reinforcement member and the adhesive layer or the base film.

As shown in FIG. 4, in Example 3, the polyimide reinforcement member 7 of 15 to 400 μm thick is provided directly, without the intervention of the adhesive layer 6, on the opposite base film surface in a region corresponding with a region on which the connector for externally connecting the patterned wiring is formed. More specifically, the reinforcement member 7 of a thermosetting polyimide is thermally contact-bonded to the base film. In this example, the reinforcement member may be provided without using the adhesive layer.

As shown in FIG. 5, in Example 4, where the TCP needs to be thinned to the same extent as the COF mounted on the plastic liquid crystal panel, the polyimide reinforcement member 7 of 15 to 400 μm thick is provided on the opposite base film surface in a region corresponding with the region on which the connector for external connection is formed as in the same manner as Examples 1 and 3. Also in this example, the adhesive layer is not necessarily used.

Hereinafter, the step of mounting the TCP or the COF on the liquid crystal panel 10, the printed substrate 11 and the like will be explained.

First, in Example 5, on the base film on which the semiconductor element 3 and the other component 13 have been mounted, the polyimide reinforcement members 7 are provided on the opposite surface of the base film 1 in a region corresponding with the region on which the connector 5 for external connection is formed and a region corresponding with the region on which other component 13 is mounted as shown in FIG. 6(a). The other component 13 is mounted by reflow heating on a mounting land on which a solder paste has been applied. Since the reinforcement member has been provided, warpage of the base film of the COF is reduced to 50% or less of a conventional COF. Thus, defective mounting of the components due to the film warpage can be prevented.

Then, as shown in FIG. 6(b), the device is separated (outer shape stamped) with a mold so as to assume an outer shape shown in FIG. 1. Thereafter, as shown in FIG. 6(c), the device is mounted on the liquid crystal panel 10 and the printed substrate 11 with the reinforcement member provided. At this time, the total pitch of the connector 5 for external connection has been precisely determined by the use of the reinforcement member 7, so that the mounting of the device on the liquid crystal panel 10 and the printed substrate 11 is favorably performed. After that, if the reinforcement member is provided on a bend portion of the base film, the reinforcement member is exfoliated from the bend portion of the base film, and then the device is mounted on an electric product such as a mobile phone.

Next, in Example 6, as shown in FIG. 7(a), the polyimide reinforcement members 7 are provided on the opposite surface of the base film 1 in the region corresponding with the region on which the connector for external connection is formed, the region corresponding with the region on which the semiconductor element is mounted and the region corresponding with the region including the bend portion for mounting the liquid crystal panel 10 and the printed substrate 11, respectively, with the intervention of the adhesive layer 6. Thereafter, as shown in FIG. 7(*b*), after the device is mounted on the liquid crystal panel 10 and the printed substrate 11, the reinforcement member 7 provided on the bend portion of the base film is exfoliated in the same manner as in Example 5 before incorporating the device into the electric product such as the mobile phone. Thus, the device can be bended for the use thereof similarly to the conventional COF.

Next, in Example 7, after the device is mounted on the liquid crystal panel 10 and the printed substrate 11 as shown in FIG. 8(*a*), all the reinforcement members 7 are exfoliated before incorporating the device into the electric product such as the mobile phone as shown in FIG. 8(*b*). Thus, the device can be formed into the same thickness as the conventional COF.

In the above Examples, the reinforcement member is partially or entirely exfoliated after the device is mounted on the liquid crystal panel or the like, but if unnecessary, it may be left on the base film surface.

As detailed above, according to the present invention, in the patterned wiring of the COF and the TCP, the connector for external connection and the portion connected with the semiconductor element are determined to have the precisely sized total pitch and the improved strength, without changing bending properties from those of the conventional COF. More specifically, the semiconductor device such as the COF and the TCP according to the present invention has the changing rate of total pitch of not more than 50% of the conventional device. Therefore the strength of the connector for external connection and of the portion connected with the semiconductor element in the patterned wiring can be improved twice or more as compared with the conventional device.

Further, the reinforcement member is exfoliated from the base film after mounting the semiconductor device of the present invention on the liquid crystal panel and the printed substrate before incorporating the device into the electric product. Therefore, the total pitch and the strength of the connector for external connection and of the portion connected with the semiconductor element in the patterned wiring are improved. Further, a liquid crystal module having a thickness and exhibiting bending properties similar to the conventional COF after incorporated into the electric product can be obtained.

What is claimed is:

1. A semiconductor device comprising a patterned wiring including a connector for external connection formed on an elongate base film, a semiconductor element or the semiconductor element and a component other than the semiconductor element mounted on and electrically connected with a portion for connection of the patterned wiring, an elongate reinforcement member provided on a surface of the base film opposite to a surface on which the patterned wiring is formed, the reinforcement member having sprocket holes at positions corresponding to the lengthwise sides of the base film, wherein the reinforcement member is further provided on said opposite base film surface in a region corresponding with a region on which the connector for external connection is formed.

2. A semiconductor device according to claim 1, wherein the reinforcement member is provided directly or with the intervention of an adhesive layer on the opposite base film surface in the region corresponding with the region on which the connector for external connection is formed.

3. A semiconductor device according to claim 1, wherein the reinforcement member is provided on the base film with the intervention of the adhesive layer so that the reinforcement member can be exfoliated at the adhesive layer.

4. A semiconductor device according to claim 2, wherein the adhesive layer adheres to the reinforcement member by an adhesive force of 500 gf/cm to 1000 gf/cm and adheres to the base film by an adhesive force greater than said adhesive force.

5. A semiconductor device according to claim 1, wherein the reinforcement member is provided on the opposite base film surface such that the reinforcement member can be exfoliated from the base film at an interface therebetween.

6. A semiconductor device according to claim 1, wherein the reinforcement member is further provided on the opposite base film surface in a region corresponding with a region on which the semiconductor element or the semiconductor element and the component other than the semiconductor element are mounted.

7. A semiconductor device according to claim 1, wherein the thickness of the reinforcement member is 15 μm or more to 400 μm or less.

8. A semiconductor device according to claim 1, wherein the reinforcement member comprises an organic film.

* * * * *